United States Patent
Yvind et al.

(10) Patent No.: US 9,337,618 B2
(45) Date of Patent: May 10, 2016

(54) WAVELENGTH SWEEPABLE LASER SOURCE

(71) Applicant: Danmarks Tekniske Universitet, Kgs. Lyngby (DK)

(72) Inventors: Kresten Yvind, Virum (DK); Thor Ansbæk, Copenhagen K (DK); Il-Sug Chung, Kgs. Lyngby (DK); Ole Hansen, Hørsholm (DK)

(73) Assignee: Danmarks Tekniske Universitet, Kgs. Lyngby (DK)

( * ) Notice: Subject to any disclaimer, the term of this patent is extended or adjusted under 35 U.S.C. 154(b) by 0 days.

(21) Appl. No.: 14/419,971

(22) PCT Filed: Aug. 7, 2013

(86) PCT No.: PCT/EP2013/066572
§ 371 (c)(1),
(2) Date: Feb. 6, 2015

(87) PCT Pub. No.: WO2014/023777
PCT Pub. Date: Feb. 13, 2014

(65) Prior Publication Data
US 2015/0171597 A1    Jun. 18, 2015

(30) Foreign Application Priority Data
Aug. 8, 2012  (EP) .................................... 12179699

(51) Int. Cl.
*H01S 5/10*       (2006.01)
*H01S 5/022*      (2006.01)
(Continued)

(52) U.S. Cl.
CPC .............. *H01S 5/1096* (2013.01); *B82Y 20/00* (2013.01); *H01S 5/0222* (2013.01);
(Continued)

(58) Field of Classification Search
CPC . H01S 5/1096; H01S 5/3013; H01S 5/34313; H01S 5/18313; H01S 5/18397; H01S 5/0222; H01S 5/18366; H01S 5/18383; H01S 5/18311; H01S 5/3406
USPC ................. 372/20, 43.01, 50.11, 50.124, 102
See application file for complete search history.

(56) References Cited

U.S. PATENT DOCUMENTS

| | | | |
|---|---|---|---|
| 7,511,870 B2 * | 3/2009 | Ho ........................... | H03B 5/30 310/314 |
| 2005/0281308 A1 | 12/2005 | Kim | |

(Continued)

OTHER PUBLICATIONS

Vail et al. ("High performance and novel effects of Micromechanical Tunable Vertical-Cavity Lasers", IEEE j. of Selected Topics in Quantum Electronics, vol. 3, No. 2, Apr. 1, 1997, pp. 691-697, XP000735970).*

(Continued)

*Primary Examiner* — Dung Nguyen
(74) *Attorney, Agent, or Firm* — Peter A. Nieves; Sheehan Phinney Bass & Green PA

(57) ABSTRACT

Wavelength sweepable laser source is disclosed, wherein the laser source is a semiconductor laser source adapted for generating laser light at a lasing wavelength. The laser source comprises a substrate, a first reflector, and a second reflector. The first and second reflector together defines an optical cavity, and are arranged to support light oscillation in the optical cavity along an optical path in a direction normal to the substrate. The optical cavity comprises a void in the optical path. The second reflector is resiliently suspended by a suspension in a distance from the first reflector and having a rest position, the second reflector and suspension together defining a microelectromechanical MEMS oscillator. The MEMS oscillator has a resonance frequency and is adapted for oscillating the second reflector on either side of the rest position. The laser source further comprises electrical connections adapted for applying an electric field to the MEMS oscillator. Furthermore, a laser source system and a method of use of the laser source are disclosed.

19 Claims, 4 Drawing Sheets

(51) Int. Cl.
  *H01S 5/183* (2006.01)
  *B82Y 20/00* (2011.01)
  *H01S 5/30* (2006.01)
  *H01S 5/343* (2006.01)
  *H01S 5/34* (2006.01)

(52) U.S. Cl.
  CPC ........ *H01S 5/18311* (2013.01); *H01S 5/18313* (2013.01); *H01S 5/18366* (2013.01); *H01S 5/18383* (2013.01); *H01S 5/18397* (2013.01); *H01S 5/3013* (2013.01); *H01S 5/34313* (2013.01); *H01S 5/18386* (2013.01); *H01S 5/3406* (2013.01); *H01S 2301/17* (2013.01)

(56) References Cited

U.S. PATENT DOCUMENTS

| | | |
|---|---|---|
| 2006/0022213 A1 | 2/2006 | Posamentier |
| 2011/0280269 A1* | 11/2011 | Chang-Hasnain ..... B82Y 20/00 372/50.1 |

OTHER PUBLICATIONS

Joseph I. Seeger and Bernhard E. Boser; Parallel-Plate Driven Oscillations and Resonant Pull-In: Solid-State Sensor, Actuator and Microsystems Workshops, Hilton Head Island, South Carolina, Jun. 2-6, 2002.

V. Jayaraman; J. Jiang; B. Potsaid; G. Cole; J. Fujimoto; A.; Design and performance of broadly tunable, narrow line-width, high repetition rate 1310nm VCSELs for swept source optical coherence tomography; Proc. SPIE 8276, Vertical-Cavity Surface-Emitting Lasers XVI, 82760D (Feb. 7, 2012).

Vail, et al; High performance micromechanical tunable vertical cavity surface emitting lasers; Electronics Letters (vol. 32, Issue: 20) : pp. 1686-1869, Sep. 26, 1996.

R. Huber, M. Wojtkowski, K. Taira, and J. G. Fujimoto; Amplified, frequency swept lasers for frequency domain reflectometry and OCT imaging: design and scaling principles; May 2, 2005 / vol. 13, No. 9 / Optics Express 3513.

Daly A et al., "10 Gbit/s Transmission Over 50 km of SMF using MEMS Tunable VCSEL", Electronics Letters, Mar. 29, 2012, pp. 394-396, vol. 48, No. 7, IEE Stevenage, GB.

Huber D. Corredoura P et al., "Reducing Brownian Motion in an Electrostatically Tunable MEMS Laser", Journal of Microelectromechanical Systems, Oct. 1, 2004, pp. 732-736, vol. 13, No. 5, IEEE Services Center, US.

Il-Sug Chung et al., "Broadband MEMS-Tunable High-Index-Contrast Subwavelength Grating Long-Wavelength VCSEL", IEEE Journal of Quantum Electronics, Sep. 1, 2010, pp. 1245-1253, vol. 46, No. 9, IEEE Service Center, US.

Cole G D et al., "SHort-Wavelength MEMS-tunable VCSELs", Optics Express Optical Society of America USA, 2008, vol. 16, No. 20, pp. 16093-16103.

Vail EC et al., "High Performance and Novel Effects of Micromechanical Tunable Vertical-Cavity Lasers", IEEE Journal of Selected Topics in Quantum Electronics, Apr. 1, 1997, vol. 3, No. 2, IEEE Service Center, US.

* cited by examiner

# WAVELENGTH SWEEPABLE LASER SOURCE

TECHNICAL FIELD

The present disclosure relates to a wavelength sweepable laser source, a laser source system and a method of use of a laser source.

BACKGROUND

In many applications, such as spectroscopy and spectral interferometry, there is a need for a wavelength tunable light source with broad optical bandwidth and rapid tuning speed. In many such applications the spectral purity of the light source is important in order to avoid parasitic signals, e.g. seen as a decrease in dynamic coherence length.

Wavelength tunable laser sources, such as tunable vertical cavity surface emitting lasers (VCSELs), are attractive for a number of applications, such as spectroscopy and optical coherence tomography (OCT). Micro-electro-mechanical system (MEMS) tunable vertical cavity surface emitting diodes (VCSELs) have the potential of enabling truly single-mode wavelength tuning with more than 10% relative tuning range and/or single-mode wavelength tuning at up to 100 MHz tuning rates. The compactness of VCSEL sources is another attractive feature for many industrial applications. Compact swept sources made by fabrication of electrical-injection VCSELs further allow wafer-scale testing.

However, in order to achieve some of the above properties of MEMS tunable VCSELs a number of issues remain to be addressed. Firstly the electro-mechanical instability of the air gap parallel-plate capacitor of a tunable VCSEL limits the achievable optical bandwidth. Operation of a tunable VCSEL laser involves the risk that the tunable reflector collapses onto the underlying substrate, a so-called "pull-in" or "snap-down", involving the risk of permanent damage of the laser source. Consequently, prior art laser sources typically only utilise a fraction of the maximum tuning amplitude of tunable reflector. In particular, the parallel-plate electro-mechanical actuator has been found to be limited by pull-in phenomena where, as the electrostatic force increases beyond the mechanical restoring force, the parallel-plate snaps to the substrate (in this case the VCSEL substrate).

Secondly, a wide deflection of the movable part of the parallel-plate actuator is desirable.

From Cole et al., Optics Express, vol. 16, (2008), p. 16093 is known a short-wavelength MEMS-tunable VCSEL, comprising DBR top and bottom reflectors, and an anti-reflection coating within the cavity. A wavelength tuning range of 30 nm is reported.

From Vail et al. Electronics Letters 32 (1996) 1888 and Jayaraman et al. Electronics Letters 48 (2012) are known other laser sources capable of tuning.

From Vail et al. IEEE Journal of Selected Topics in Quantum Electronics, vol. 3 (1997) pp. 691 is known that an alternating current (AC) voltage can be used to oscillate the MEMS oscillator at either side of the rest position thus both providing blue-shift and red-shift of the wavelength. The air gap is designed to be 1.41 µm, or $3/2\lambda$ in air, which results in a MEMS-oscillator safe stroke length of 470 nm (that is the stroke length than can be accommodated before pull-in will occur). Vail et al. describe that the voltage required for a given wavelength change can be reduced by driving the MEMS oscillator at resonance with a square waveform with peak voltage of 16 V. In this way the VCSEL can be swept across its full tuning range of 12 nm. With a wavelength tuning efficiency of 0.04 the required stroke of the MEMS oscillator to achieve the full tuning range is 300 nm. Given that the MEMS oscillator deflects at either side of the rest position the required 150 nm downward deflection is within the stable region and the pull-in instability is avoided. Larger deflections of the MEMS oscillator using a square waveform would result in dynamic pull-in. The dynamic pull-in instability is known from e.g. Seeger et al. Solid-State Sensor, Actuator and Microsystems Workshop Jun. 2-6 (2002) 0-9640024-4-2, which teaches that pull-in occurs at 56% of the air gap in the rest position for square-wave excitation at the resonance of the MEMS oscillator.

Jayaraman et al. teach in Proc. SPIE vol. 8276 (2012) pp. 82760D, Electronics Letters vol. 48 (2012) pp. 867-869 how the ⅓ gap rule can be exceeded under repetitive sinusoidal sweeping. The static snap-down instability can be exceeded by repetitive sweeping, but the dynamic snap-down instability will still limit the tuning range.

Hence, an improved laser source and laser source system would be advantageous, and in particular a laser source and laser source system having an extended tuning range would be advantageous.

It is further desirable to reduce the risk of damaging the laser source during operation.

In particular, it may be seen as an object of the present invention to provide a laser source, a laser source system and a method of use of a laser source that increases the tuning range of laser sources of the prior art.

It is a further object of the present invention to provide an alternative to the prior art.

SUMMARY

According to a first aspect, disclosed herein are embodiments of a wavelength sweepable laser source. The laser source is a semiconductor laser source adapted for generating laser light at a lasing wavelength. The laser source comprises a substrate, a first reflector, and a second reflector. The first and second reflectors together define an optical cavity, and are arranged to support light oscillation in the optical cavity along an optical path in a direction normal to the substrate. The optical cavity comprises a void in the optical path. The second reflector is resiliently suspended by a suspension at a distance from the first reflector and having a rest position. The second reflector and suspension together defines a microelectromechanical MEMS oscillator, the MEMS oscillator having a resonance frequency and being adapted for oscillating the second reflector on either side of the rest position. The laser source further comprising electrical connections adapted for applying an electric field to the MEMS oscillator. In this way, the voltage source may make the MEMS oscillator oscillate by inducing an electrostatic attraction between the substrate and second reflector. Thereby the second reflector may be made to sweep both closer to and further away from the first reflector, when compared to the rest position of the second reflector. Since the length of the cavity determines the wavelength of the light emitted from the laser, the wavelength of light may thus be swept to both shorter and longer wavelength, compared to the wavelength of the laser source when the second reflector is in the rest position. Additionally, in this way the MEMS oscillator may sweep over a significant part or even the whole of the void to increase the variation of the cavity length and thus the wavelength variation obtainable by the laser source. Hence, during operation, the laser source emits laser light at a lasing wavelength where the lasing wavelength sweeps back and forth across the tuning bandwidth defined by the amplitude of the oscillating second reflector. The sweeping speed is determined by the frequency at which the second reflector oscillates.

The laser source according to the first aspect disclosed herein is packaged so as to keep the MEMS oscillator, at least under operation, under a low or medium vacuum having a pressure of 200 Torr or less. To this end, the laser source may be disposed within a housing operable to maintain a partial vacuum having a pressure of 200 Torr or less within the housing. The packaging may be provided as a metal housing having a window for allowing laser light to exit the housing.

Packaging the laser source in a housing to form a low or medium vacuum around the reflector significantly increases the mechanical quality factor of the MEMS oscillator. Moreover, oscillators may be provided that have a high resonance frequency and, thus, fast wavelength sweep cycles without requiring unnecessarily high drive voltages.

Moreover, the inventors have realised that a MEMS oscillator having a high mechanical quality factor may be driven by a modulated voltage waveform comprising short pulses and having a low average voltage, i.e. without causing the oscillation of the MEMS oscillator to be significantly asymmetric relative to its rest position and towards the first reflector. Consequently, the risk of a pull-in of the oscillator may significantly be reduced.

Embodiments of the laser source thus enable symmetric actuation of the MEMS oscillator of a tunable VCSEL which, in turn, allows for an increased wavelength tuning range. The actuation of the MEMS oscillator depends on the voltage waveform squared and the actuation causes a constant offset and a number of superimposed harmonic terms in the deflection of the MEMS oscillator. The constant offset is an undesired effect when a wide bandwidth is desired. The constant offset depends on the amplitude of the voltage waveform and, in order to achieve symmetric actuation of the MEMS oscillator about the rest position, the peak voltage should be small. In order to obtain sufficient actuation with a low peak voltage, the MEMS oscillator should have a high mechanical quality factor. This is achieved by packaging the MEMS oscillator in partial vacuum.

In some embodiments of the laser source, the semiconductor laser comprises a vertical cavity surface emitting laser VCSEL. In this way, a particularly short cavity may be achieved, which is attractive to obtain a long free spectral range (FSR) and thus an extended wavelength sweeping range.

In some embodiments of the laser source, the semiconductor laser is electrically pumped.

In some embodiments of the laser source, the first reflector is or comprises a distributed Bragg reflector (DBR). In this way, manufacturing of the laser source is simplified.

According to some embodiments, the DBR comprises semiconductor materials (for convenience called a "semiconductor DBR" throughout this text).

In some embodiments, the DBR comprises dielectric materials (so-called "dielectric DBR").

In some embodiments of the laser source, the first reflector is or comprises a high index-contrast subwavelength grating (HCG).

In some embodiments of the laser source, the second reflector is or comprises a sub-wavelength grating. The sub-wavelength grating may act as a polarization stabilization structure while reflectivity may be provided by an alternative structure. In one embodiment, the alternative structure is a DBR.

In some embodiments of the laser source, the second reflector is or comprises a high index-contrast subwavelength grating (HCG). In this way, an efficient reflector having a particularly short penetration depth and low weight may be achieved. Thus, a particularly short cavity length may be achieved. Therefore, a higher resonance frequency and wider wavelength sweeping range may be obtained.

In some embodiments of the laser source, the second reflector is or comprises a distributed Bragg reflector DBR. In one embodiment of the invention, the DBR is a semiconductor DBR. In an alternative embodiment of the invention, the DBR is a dielectric DBR.

In some embodiments of the laser source, the laser source comprises an anti-reflection coating in the optical path in the cavity. In this way the laser source may achieve an extended wavelength sweeping range.

In some embodiments of the laser source, the anti-reflection coating is fabricated by oxidation of an $Al_xGa_{1-x}As$ layer, where x is larger than 0.7. In this way, the anti-reflection coating may be integrated in a monolithically formed laser source.

In some embodiments of the laser source, the laser source comprises an active region in the optical path of the cavity, the active region comprising at least a first quantum well QW region adapted for having a bandgap corresponding to a first gain wavelength range, the first QW region being located in a first distance from the first reflector. In a particular embodiment, the first distance is chosen to make the first QW region substantially coincide with an anti-node of a first electrical field when the laser operates at a wavelength in the first gain wavelength range. In this way, gain in the first gain wavelength range is maximized.

In some embodiments of the laser source, the active region further comprises a second quantum well QW region adapted for having a bandgap corresponding to a second gain wavelength range, the second QW region being located in a second distance from the first reflector, wherein the second gain wavelength being longer than the first gain wavelength, and the second distance being larger than the first distance. In this way, the laser source may be adapted for providing optical gain over an extended sweeping range, by having two or more QW materials adapted for providing gain to the range of spectral components in the sweeping range. By spatially shifting the QW materials, an improved overlap is obtained with a standing wave in the laser, thereby improving optical gain at the different wavelengths. In one embodiment, the laser source comprises multiple first and second QW regions interleaved along the optical path of the cavity, in order to improve the overlap with standing waves at the first gain wavelength range or the second gain wavelength range, respectively, while improving gain.

In some embodiments of the laser source, the laser source supports a first laser mode and a second laser mode, in particular a first and a second longitudinal laser mode, and wherein the first distance is chosen so that a first overlap between the first QW material and the first laser mode is larger than a second overlap between the first QW material and the second laser mode. In this way, the laser source may be adapted to discriminate the second laser mode to prevent or limit mode-hops, where the laser source would suddenly shift from emitting light corresponding to the first mode to emitting light corresponding to the second mode.

In some embodiments of the laser source, the MEMS oscillator has a quality factor Q of about 2 or higher, or about 5 or higher, or about 10 or higher, such as about 80 or higher, and/or wherein the MEMS oscillator has a quality factor of about 300 or lower, or about 200 or lower, such as about 120 or lower. In this way, the MEMS oscillator may conveniently be made to oscillate, while still accepting minor deviation of the modulation frequency from the resonance frequency. As will be described below the quality factor may be increased by packaging the MEMS oscillator in a partial vacuum; alternatively or additionally, the quality factor may be adjusted by a careful mechanical design of the oscillator. The quality factor Q may be measured by measuring the center frequency of the resonator and the bandwidth at the 3-dB level, e.g. by measuring the modulation amplitude of the MEMS oscillator while applying a small modulation voltage at varying frequency. The quality factor may then be determined as the center frequency divided by the bandwidth at the 3-dB level.

According to the first aspect, the MEMS oscillator at least under operation is kept under a medium or low vacuum. In this way, the quality factor Q of the MEMS oscillator may be increased significantly, by decreasing air drag. In some embodiments of the laser source, the pressure is about 150 Torr or less, or even about 100 Torr or less. In some embodiments, the low pressure is about 0.0001 Torr or more, such as 0.001 Torr or more, such as 0.1 Torr or more, such as about 0.5 Torr or more, or even about 1 Torr or more. In a specific embodiment, the low pressure is medium vacuum or low vacuum. At these pressure levels, suitable mechanical quality factors Q may be achieved, Furthermore, packaging of the laser source at such levels may be relatively simply achieved, e.g. by means of a transistor outline (TO) can. For example, the packaging process may be performed in a vacuum chamber under controlled vacuum of a desired level. The vacuum level of the packaged laser source may be verified by measuring the Q factor of the MEMS oscillator of the packaged laser source.

Generally, the substrate extends in a substrate plane and it may have an extent in each direction within the substrate plane larger than a thickness of the substrate; the direction normal to the substrate may thus be defined as a direction normal to the substrate plane. The laser source may comprise a layered structure including a boundary layer having a surface that, together with a surface of the second reflector, defines the void. The boundary layer may be the substrate or another layer of the layered structure. The void has a gap width in the direction normal to the substrate plane. A rest gap width may be defined as the distance between the boundary layer and the second reflector when the second reflector is in its rest position.

In some embodiments of the laser source, the laser MEMS oscillator is driven by an alternating current (AC) modulation voltage. In this way, a particularly simple control of the modulation voltage may be realized. In this embodiment, the modulation frequency is preferably chosen to be substantially half the resonance frequency. In some embodiments of the laser source, the modulating voltage is a pulsating direct current (DC).

The present disclosure relates to different aspects, including the laser source described above and in the following, a laser source system and corresponding systems, devices, methods and products, each yielding one or more of the benefits and advantages described herein, and each having one or more embodiments corresponding to the embodiments described in connection with the first-mentioned aspect and/or as disclosed in the dependent claims or the present description.

According to a second aspect, disclosed herein are embodiments of a swept laser source system, wherein the system comprises: a laser source and a voltage source, wherein the laser source is a semiconductor laser source adapted for generating laser light at a lasing wavelength, the laser source comprising a substrate, a first reflector, and a second reflector, the first and second reflectors together defining an optical cavity, and being arranged to support light oscillation in the optical cavity along an optical path in a direction normal to the substrate, the optical cavity comprising a void in the optical path, the second reflector being resiliently suspended by a suspension in a distance from the first reflector and having a rest position, the second reflector and suspension together defining a microelectromechanical (MEMS) oscillator, the MEMS oscillator having a resonance frequency and being adapted for oscillating the second reflector on either side of the rest position, the laser source further comprising electrical connections adapted for applying an electric field to the MEMS oscillator.

The voltage source is adapted for applying a pulsating direct current (DC) modulation voltage to the MEMS oscillator via the electrical connections of the laser source. The voltage source may be adapted for modulating the modulation voltage as a pulse train. Use of a pulsating direct current voltage allows a reduction of the asymmetry of the oscillation relative to the rest position, as the effective average DC offset of the drive voltage is reduced. For a given gap width, this in turn allows an increase of the MEMS oscillator stroke.

In particular, embodiments of the laser source system described herein allow the MEMS oscillator stroke to be increased to substantially 200% of the air-gap in the rest position. In some embodiments, this may be obtained by excitation of the MEMS oscillator at resonance using a pulse train waveform with low duty cycle, thereby avoiding the dynamic pull-in instability present when a sinusoidal AC waveform is used. This allows the design of MEMS tunable VCSELs with quarter wavelength air-gap that can achieve the tuning ranges stated above.

Accordingly, in some embodiments the pulse train has a modulation frequency that matches the resonance frequency. The modulation frequency matching the resonance frequency is intended to include, in particular, the modulation frequency being equal to the resonance frequency within normal control and measurement tolerances. Another example of matching the modulation frequency to the resonance frequency comprises embodiments where the oscillator is only driven during some of the periods of the oscillation, e.g. by providing a driving pulse only during every other period, i.e. at half the resonance frequency of the oscillator. Accordingly, in some embodiments, the modulation frequency may be equal to, or at least substantially equal to the resonance frequency, or the modulation frequency may be an integer fraction of the resonance frequency. Here the term substantially equal refers to a modulation frequency that deviates from the resonance frequency no more than f/2Q, where f designates the resonance frequency and Q is the quality factor of the oscillator.

To this end, in some embodiments, the laser source system comprises a frequency control circuit adapted to match a frequency of the pulsating direct current to the resonance frequency of the MEMS oscillator. For example, the frequency control circuit may implement a phase-locked loop.

The dynamic pull-in instability of prior art laser systems is particularly limiting on the tuning range for electrical injection VCSELs where the semiconductor cavity also encompasses current injection and current confinement layers. In order to keep the optical cavity length constant with the addition of current injection and confinement layers, the air gap can be reduced. In some embodiments, the air gap has a width smaller than half the center wavelength of the laser source, e.g. about a quarter of the center wavelength. By using a design with an air-gap of quarter-lambda the Free Spectral Range (FSR) can be increased by more than 70% compared to prior art laser systems that have an air-gap of typically one lambda. This can be done since, with pulse actuation having a duty cycle of less than 10%, the full gap and, thus, the full spectral range can be tuned. In some embodiments of the laser source system, the MEMS oscillator at least under operation is kept under a medium or low vacuum. In this way, the quality factor Q of the MEMS oscillator may be increased significantly, by decreasing air drag. In some embodiments, the vacuum has a pressure of about 200 Torr or less, such as about 150 Torr or less, or even about 100 Torr or less, and/or the pressure is about 0.0001 Torr or more, such as 0.001 Torr or more, such as 0.1 Torr or more, such as about 0.5 Torr or more, or even about 1 Torr or more. At these pressure levels, suitable mechanical quality factors Q may be achieved, Furthermore, packaging of the laser source at such levels may be relatively simply achieved, e.g. by means of a TO can.

In some embodiments, the voltage source is configured to only apply a non-zero modulating voltage when the second reflector passes the rest position in a direction towards the first reflector, e.g. by providing pulses when the second reflector passes the rest position in a direction towards the substrate. Hence, the second reflector may be made to sweep substantially the full range of the void without the risk of a snap-in occurring. This is achieved since the modulating voltage is removed when the second reflector is in the unstable region, i.e. having a deflection larger than $1/3$ of the void. In some embodiments, the pulse train has a duty cycle of less than 15%, such as less than 12%, such as less than 11%, such as less than 10%, such as less than 5%, such as less than 1%. The duty cycle may be measured as a ratio of the pulse duration and the pulse period. The pulse duration may be determined as the full width at half maximum (FWHM) of the pulse. It will be appreciated that the pulses of the pulse train may have different pulse forms, such as rectangular, Gaussian, etc. In some embodiments each pulse may start before and end after the second reflector passes its rest position. For example, the pulses may be symmetric around the crossing of the second reflector through its rest position. It will be appreciated that the pulses may be asymmetric relatively to the reflector passing its rest position and even be timed such that they occur before or after the reflector passes the rest position towards the substrate. In any event, the phase and duty cycle of the pulse train is preferably controlled such that the modulating voltage is removed when the second reflector is in the unstable region, i.e. having a deflection larger than $1/3$ of the void.

In some embodiments of the laser source system, the laser source is according to any of above mentioned embodiments.

In some embodiments of the laser source system, the modulation voltage is modulated by a waveform that sustains the mechanical oscillation. Accordingly, in some embodiments, the laser system comprises a pulse control circuit configured to control a width and/or amplitude of the pulses so as to sustain the mechanical oscillation at a predetermined amplitude. To this end, the pulse control circuit may control the amplitude and/or duration of the pulses responsive to at least one of the quality factor of the MEMS oscillator and the sweep bandwidth of the laser source system (or a measured parameter indicative of one or more of these quantities). Generally, the amplitude of the oscillation of the MEMS oscillator is smaller than the rest gap width. In some embodiments, the voltage source is controlled so as to maintain an oscillation of the MEMS oscillator at an amplitude larger than 50% of the rest gap width, such as larger than 75% of the rest gap width, such as larger than 80% of the rest gap width, e.g. larger than 90% of the rest gap width.

The frequency control circuit and the pulse control circuit may be implemented as separate control circuits or as a combined control circuit. Each control circuit may be implemented by hardwired circuitry and/or by a programmable microprocessor such as a digital signal processor. The control circuit(s) may receive one or more measured sensor signals and may be configured to control the frequency and/or duty cycle and/or amplitude of the pulses responsive to the sensor signal(s). The sensor signal(s) may e.g. be indicative of the tuning bandwidth of the emitted laser light and/or a tuning frequency and/or tuning phase of the emitted laser light. To this end, the laser source system may comprise a beam splitter adapted to direct a portion of the generated laser light—via a dispersive element, a bandpass filter, or another suitable optical element—to a light-sensitive sensor or sensor array. Alternatively or additionally, the sensor may comprise a deformation sensor, e.g. an optical deformation sensor measuring the actual deformation of the MEMS oscillator. Further examples of deformation sensors include a piezoresistive sensor or a piezoelectric sensor which can be conveniently incorporated in the MEMS using AlGaAs.

According to a third aspect, disclosed herein are embodiments of a method of use of a laser source, wherein the laser source comprises a vertical cavity surface emitting laser VCSEL, the VCSEL comprising a first reflector and a microelectromechanical system MEMS second reflector, the second reflector being a part of the VCSEL cavity and being actuatable by an applied voltage to the MEMS, the MEMS having a resonance frequency, the method comprises applying a modulated pulsating direct current voltage from a voltage source to the MEMS of the laser source for actuating the position of the second reflector, the modulated voltage having a modulation frequency matching the resonance frequency.

In some embodiments, the laser source is according to any of abovementioned embodiments and the voltage source is according to any of the abovementioned embodiments.

The invention is particularly, but not exclusively, advantageous for obtaining an extended wavelength tuning range. Embodiments of the various aspects disclosed herein are particularly, but not exclusively, suitable for ultra-high resolution optical coherence tomography and other applications where more than 10% relative tuning range about a centre wavelength is required. For a swept light source with a square intensity spectrum the tuning range required to match the current axial resolution of 5 μm in tissue of spectral domain OCT would be 100 nm at 850 nm central wavelength, 160 nm at 1060 nm central wavelength and 240 nm at 1310 nm central wavelength.

Embodiments of the first, second and third aspects disclosed herein may each be combined with any of the other aspects. These and other aspects of the invention will be apparent from and elucidated with reference to the embodiments described hereinafter.

BRIEF DESCRIPTION OF THE FIGURES

An embodiment of the laser source, laser source system and of the method of use disclosed herein will now be described in more detail with regard to the accompanying figures. The figures and accompanying description show and describe one way of implementing the various aspects disclosed herein and are not to be construed as being limiting to other possible embodiments falling within the scope of the attached claim set.

DETAILED DESCRIPTION

Figure 1:
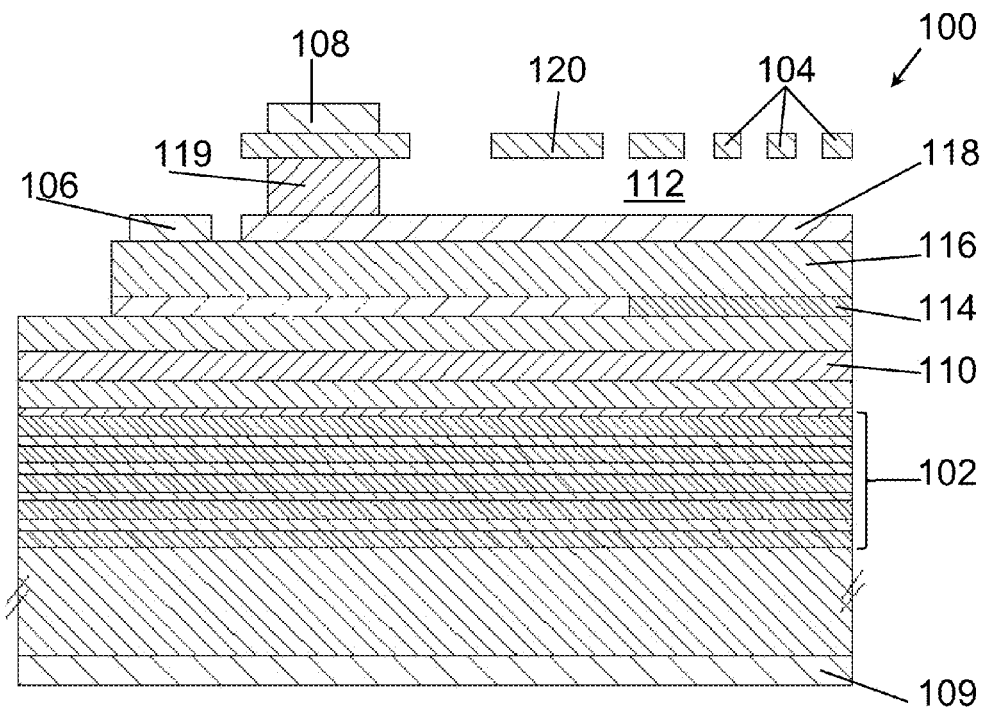
FIG. 1 is a schematic cross-sectional view of a laser source.

Shown in FIG. 1 is a schematic cross-sectional view of a laser source 100 according to an embodiment of the laser source disclosed herein. The embodiment shown here is of the vertical-cavity surface-emitting laser-type (VCSEL) and comprises a bottom (first) reflector in the form of a distributed Bragg reflector (DBR) 102 and a top (second) high-index contrast subwavelength grating (HCG) 104 surrounded by air. The second reflector is resiliently mounted to the structure by a suspension 120 comprising a microelectromechanical system (MEMS). By applying a voltage between a first MEMS contact 106, doubling as an intra-cavity laser anode, and a second MEMS contact 108 in proximity to the second reflector, an electrostatic force acting to attract the second reflector 104 towards the first reflector 102 may be introduced. As the electrostatic force may only attract and thus not repel the first reflector, the cavity as defined by the two reflectors may only be shortened by static tuning. It is well known that by static, electrostatic tuning, the second reflector may not be deflected more than about ⅓ of the distance of the air-gap 112 without the system becoming unstable. If this limit is crossed, a "pull-in" may occur, wherein the second reflector may crash into a facing surface of the air gap. This results from the fact that at this ⅓-position, the attracting force increases to exceed the restoring force from the suspension. However, the inventors have realized that by dynamically operating the laser source this limitation may be ameliorated. The second reflector and the suspension together form a MEMS oscillator having a mechanical resonance frequency. By adapting the MEMS oscillator to have a suitably high mechanical quality factor (Q), the second reflector may initiate a substantially symmetrical oscillation around a rest position of the MEMS. This requires that a modulating voltage is applied across the MEMS contacts with a modulating frequency equal to the resonance frequency or otherwise matching the resonance frequency. Thus, the movement of the second reflector may act to both shorten and lengthen the cavity during oscillation, which in turn changes the cavity to support both shorter and longer wavelengths, respectively.

The laser anode 106 together with a laser cathode 109 together enables carrier injection into an active region 110, which is here in the form of a multiple quantum well (MQW) structure. In other words, in this embodiment, the laser is electrically pumped. In other embodiments, however, the laser source may be optically pumped.

Figure 2:
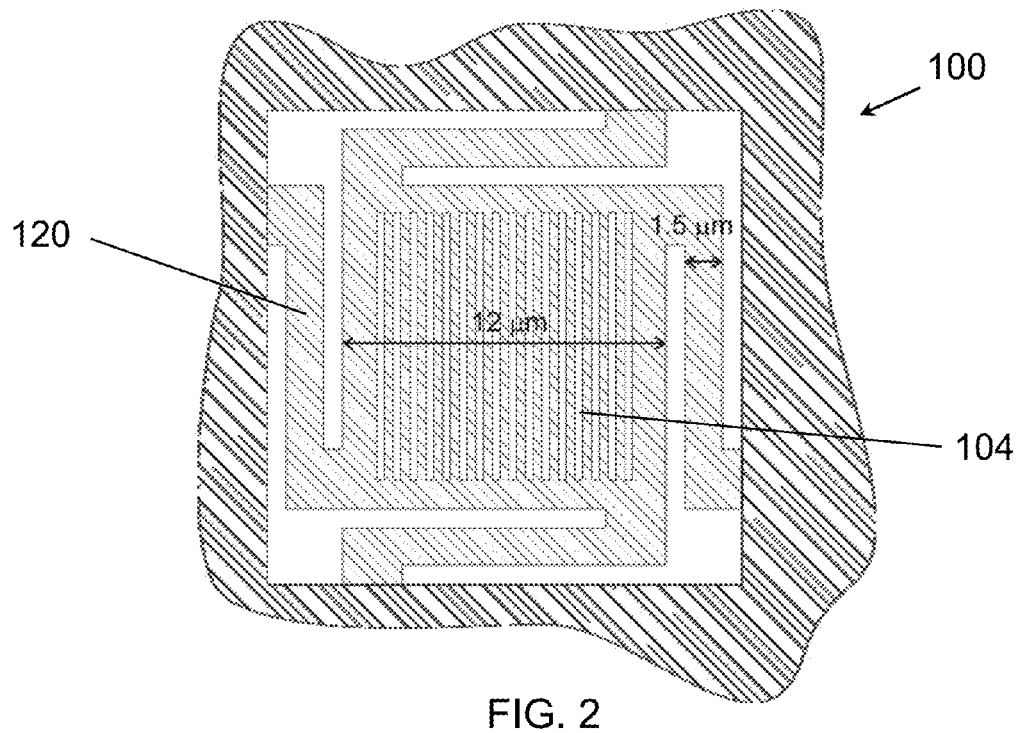
FIG. 2 is a top-view sketch of an embodiment of the second reflector and MEMS of a VCSEL.

FIG. 2 shows a top-view sketch of a VCSEL according to an embodiment of the laser source disclosed herein. The embodiment corresponds to the one shown in FIG. 1. The second reflector, in the form of a HCG 104 is clearly seen. Furthermore, the suspension 120 is also apparent as four deflecting beams, one on each side of the HCG. The laser source 100 is chosen to be of the extended cavity design type, as this configuration has the best trade-off between threshold material gain and tuning efficiency. The bottom n-doped DBR reflector 102 has 35 mirror pairs of $Al_{0.9}Ga_{0.1}As/GaAs$. The DBR reflectance is made larger than the top HCG reflectance to achieve a top-emitting structure. The active region 110 comprises $In_{0.3}Ga_{0.7}As$ MQWs placed at the anti-node of an electric field at a wavelength of 1060 nm. The $In_{0.3}Ga_{0.7}As$ layers are highly strained and in order to compensate $GaAs_{0.8}P_{0.2}$ is used as barrier layers. Current confinement is achieved through introduction of an oxide aperture 114, by oxidizing a 55 nm $Al_{0.98}Ga_{0.02}As$ layer. An oxide aperture of 8 μm was found to ensure single-mode operation. A moderately p-doped GaAs current spreading layer 116 makes up the anode of the pin-junction diode. In order to reduce the parasitic reflectance at the high-index contrast semiconductor to air interface, an $Al_2O_3$ anti-reflective coating (ARC) 118 is employed. The final air-gap 112 height is defined by a sacrificial layer 119, which is removed during processing. The final layer of n-doped GaAs is structure into a HCG reflector, here with a thickness of 280 nm, a period of 460 nm and a duty cycle of 0.72.

Figure 3:
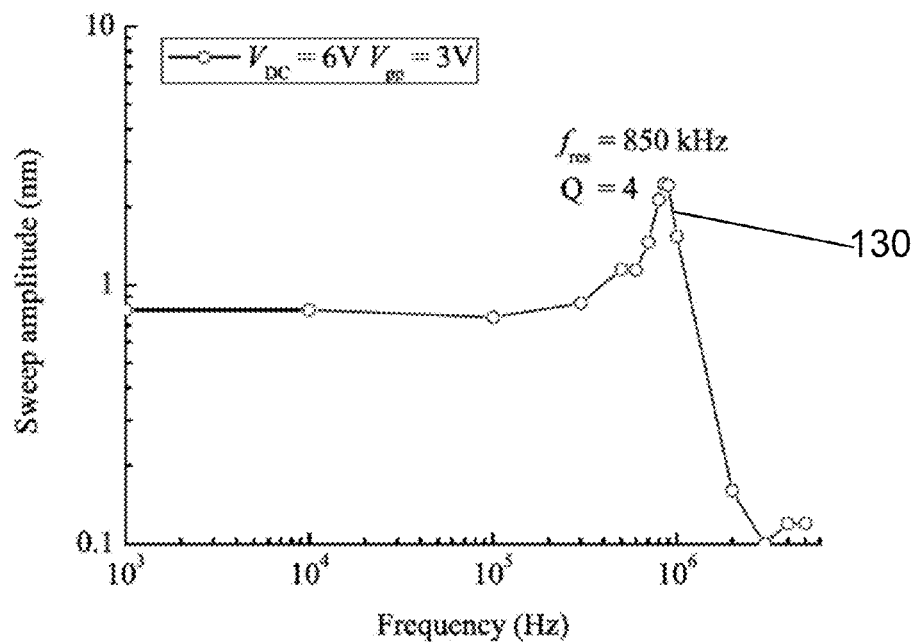
FIG. 3 shows the wavelength change as result of the mechanical response as a function of modulation frequency of an embodiment of a laser source.

FIG. 3 shows the small-signal modulation response of the VCSEL of FIGS. 1 and 2. The MEMS oscillator was modulated with a DC offset of 6V superimposed with a 3 Vpp AC component. The response is seen to be largely constant for frequencies up to about $10^5$ Hz, after which, the resonance peak 130 begins to show. The resonance frequency is found to be 850 kHz and the Q factor for the oscillator, here operating in atmospheric air is found to be 4. In contrast, Q was determined to be 2490 in partial vacuum.

Figure 4:
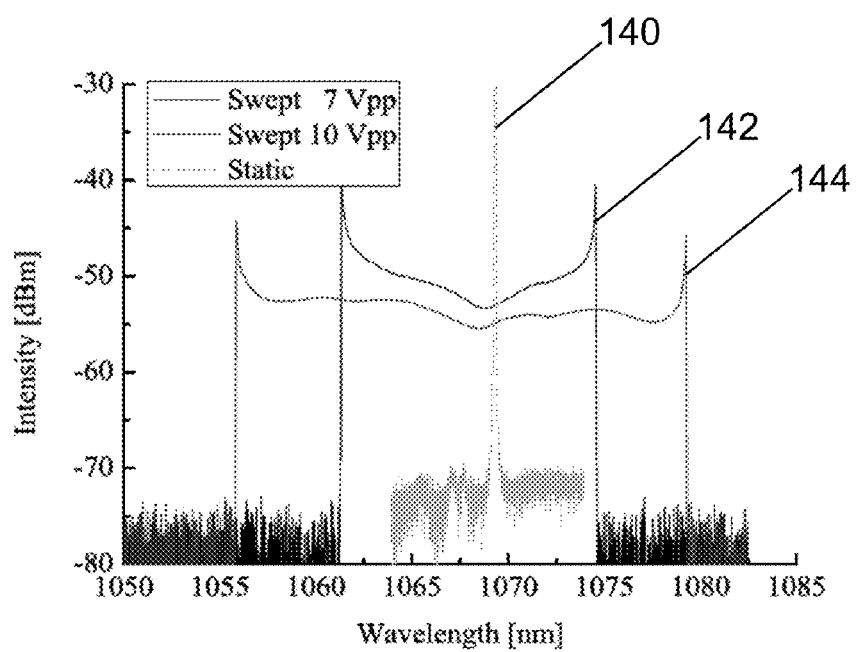
FIG. 4 shows emission spectra of a laser source.

FIG. 4 shows the time-averaged emission spectra of the VCSEL of FIG. 1. If static tuning is used, a spectrum showing a single peak 140 is obtained, corresponding to the laser line here at 1069 nm. However, if a modulating voltage of 7 Vpp at a frequency of 850 kHz is applied, a broadened spectrum 142 is seen, here having a spectral width of about 12 nm. If the modulation voltage is increased to 10 Vpp, an even wider spectrum 144 is observed, wherein the laser source is swept at about 24 nm.

Figure 5:
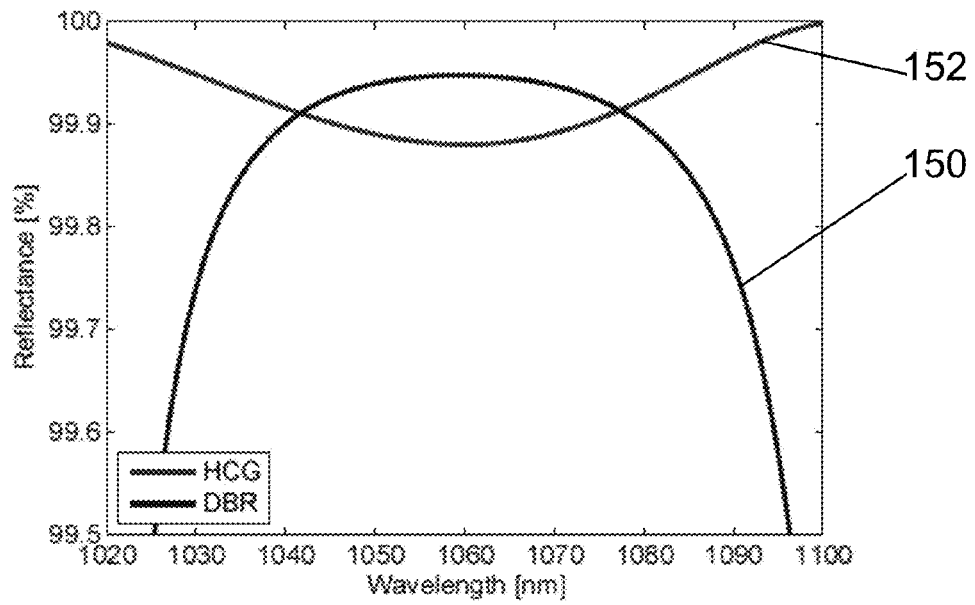
FIG. 5 shows calculated reflectance spectra corresponding to embodiments of the laser source disclosed herein.

FIG. 5 shows calculated reflectance spectra for a 30-pair $Al_{0.9}Ga_{0.1}As/GaAs$ DBR 150 and a HCG reflector 152, respectively. Both reflectors are similar to those described above for the VCSEL. However, the DBR has fewer pairs than the abovementioned. It is seen that the HCG spectrum 152 shows higher reflectance than the DBR outside a 40 nm bandwidth. For the laser source to emit light in the top-direction, the reflectance of the second reflector must be smaller than that of the first reflector.

Figure 6:
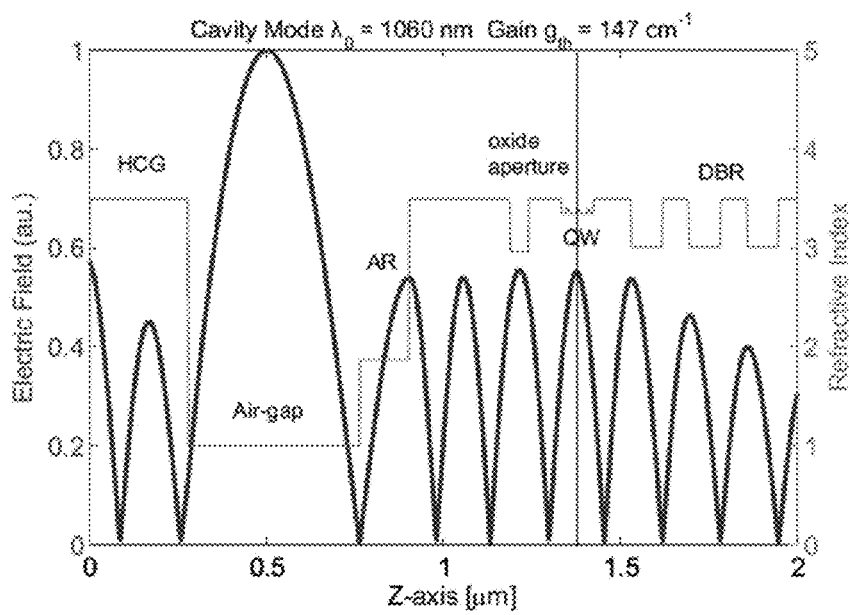
FIG. 6 shows a refractive index and electrical field profile calculated for an embodiment of the laser source disclosed herein.

FIG. 6 illustrates the refractive index and the electrical field profiles throughout the laser source structure. The electrical field corresponds to a wavelength of 1060 nm. It is seen that the QW are located corresponding to an anti-node of the electrical field in order to maximize the overlap and thus the amplification. When the laser source is tuned, the electrical field will change profile within the structure. Therefore, the position of anti-nodes will also shift, so that for shorter wavelengths the anti-nodes are closer to the first reflector, while for longer wavelength the anti-nodes are further away from the first reflector. In one embodiment of the invention, QWs providing gain at different wavelengths are included in the structure. In another embodiment, QWs corresponding to short wavelengths are placed closest to the first reflector while QWs corresponding to longer wavelengths are placed further away from the first reflector.

Figure 7:
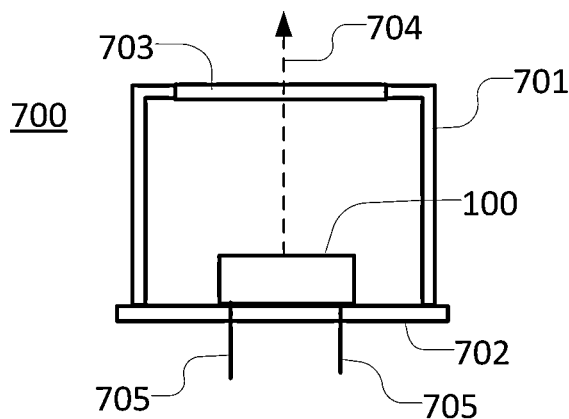
FIG. 7 shows a schematic block diagram of an example of a laser device.

FIG. 7 shows a schematic block diagram of an example of a laser device. The laser device, generally designated 700, comprises a laser source 100 as described herein, e.g. a laser source as described in connection with FIGS. 1 and 2 above. The laser source 100 is configured to emit a laser beam 704. The laser source 100 is encapsulated in a housing formed by a base plate 702, to which the laser source 100 is attached and a dome or cup shaped cover 701 having an open end covered by the base plate 702. The cover 701 comprises a window 703 allowing the laser beam 704 to exit the housing. The base plate 102 and the cover (other than the window) may be made from metal or another suitable material allowing a medium or low vacuum to be maintained inside the housing, and allowing heat generated by the laser source to be dissipated. The window 703 may be made from glass, e.g. borosilicate glass. In some embodiments the window may be formed as a lens and/or the device may comprise one or more additional optical elements such as a lens. The electrical contacts 705 to the laser source 100 may be led through the base plate. Generally, the housing may be formed as a transistor outline (TO) can.

During assembly, the interior of the housing may be at least partially evacuated so as to provide a low or medium vacuum inside the housing. For example, the interior of the housing may be maintained at a low pressure of about 200 Torr or less, such as about 150 Torr or less, or even about 100 Torr or less. In some embodiments, the low pressure is about 0.0001 Torr or more, such as about 0.001 Torr or more, such as about 0.1 Torr or more, such as about 0.5 Torr or more, or even about 1 Torr or more. It will generally be appreciated that other forms of packaging are possible, such as a vacuum packaging at wafer level.

Figure 8:
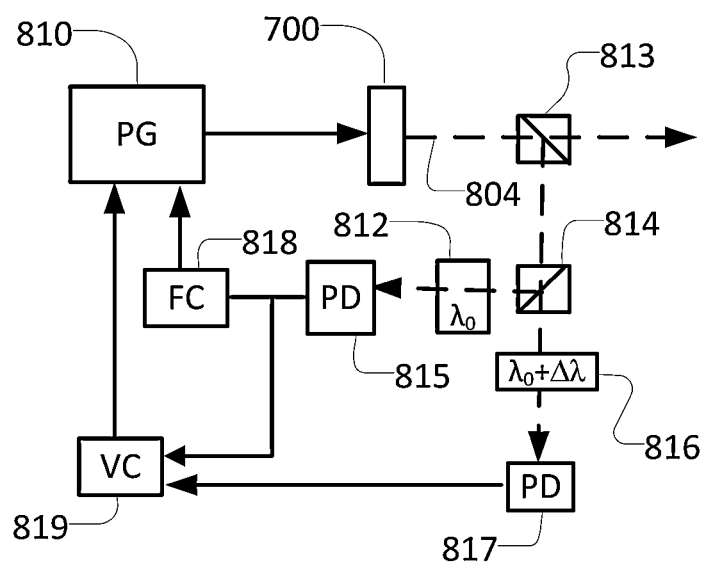
FIG. 8 shows a schematic block diagram of an example of a laser source system.

FIG. 8 shows a schematic block diagram of an example of a laser source system. The laser source system comprises a laser device 700, e.g. the laser device described in connection with FIG. 7. The system further comprises a pulse generator voltage source 810 connected to the laser device and operable to provide a modulated voltage in the form of a pulse train to the laser source device for driving the MEMS oscillator of the laser source at its resonance frequency. The system further comprises a voltage control unit 819 connected to the pulse generator 810 and operable to control the amplitude of the pulses generated by the pulse generator 810. The system further comprises a frequency control unit 818 connected to the pulse generator 810 and operable to control the frequency of the pulses generated by the pulse generator 810. The system further comprises photo diodes 815 and 817, respectively, optical band pass filters 812 and 816, respectively, and beam splitters 813 and 814, respectively. Beam splitter 813 is configured to direct a part of the output beam 704 from the laser device as a diagnostic beam towards the other beam splitter 814, while the remaining portion of the output beam is emitted as output beam of the laser system. Beam splitter 814 divides the diagnostic beam in two partial diagnostic beams, one of which is directed through band pass filter 812 towards photo diode 815 while the other partial diagnostic beam is directed through band pass filter 816 towards photo diode 817.

Band pass filter 812 is configured to only let a small wavelength range around the centre wavelength $\lambda_0$ pass. Consequently, photo diode 815 generates a pulse each time the MEMS oscillator passes through its rest position. The pulses from photo diode 815 thus reflect the frequency and phase of the oscillation of the MEMS oscillator. The pulses are fed to the frequency control circuit 818 which generates, based on the signal from photo diode 815, a trigger signal to trigger the pulses of the pulse generator. For example frequency control circuit 818 may implement a phase-locked loop so as to control the frequency and phase of the pulse train.

Band pass filter 816 is configured to only let a small wavelength range around a wavelength pass that is displaced from the centre wavelength $\lambda_0$. Consequently, photo diode 817 generates a pulse each time the MEMS oscillator passes through a given displacement position. The phase difference between the pulses generated by photo diodes 815 and 817 are thus a measure of the velocity of the MEMS oscillator when passing through the rest position. The signals from photo diodes 815 and 817 are fed into the voltage control circuit which controls the pulse amplitude of the pulses generated by pulse generator 810, so as to maintain a constant phase difference between the pulses from the respective photo diodes and, thus, so as to maintain the oscillation of the MEMS oscillator at a desired amplitude.

Hence, generally, the laser source system comprises control circuitry to control the oscillating frequency and/or amplitude of the MEMS reflector and, optionally, even the phase of the oscillation. Responsive to received detector signals, the control circuit may control the operation parameters of the voltage source so as to drive the oscillator at the resonance frequency of the oscillator and so as to maintain a desired amplitude of oscillation, i.e. the desired sweeping range.

In some embodiments, the amplitude of the voltage pulses are controlled as a function of the duty cycle, the quality factor Q of the MEMS oscillator and the critical static voltage $V_{PI}$ at which pull-in occurs. The duty cycle may be defined as the ratio of the pulse duration $\tau$ and the pulse period T.

In particular, when driven at the resonance frequency of the oscillator, the amplitude $V_0$ of the voltage pulses may be determined as $$V_0 = \sqrt{\frac{27}{8}\frac{\pi}{Q}\frac{1+\sin^2\left(\pi\frac{\tau}{T}\right)}{\sin\left(\pi\frac{\tau}{T}\right)}}\, V_{PI}$$

Where the critical electrostatic pull-in voltage is $$V_{PI} = \sqrt{\frac{8kg_0^3}{27\epsilon A}},$$

And where k is the spring constant of the oscillator, $g_0$ is the rest gap width, $\in$ is the dielectric constant of the gas remaining in the air gap, and A is the capacitor area of the capacitor. The duty cycle is preferably selected smaller than 11%.

It will be appreciated that some embodiments of a laser source system may comprise additional or alternative circuitry, such as additional control circuitry and/or signal acquisition and processing circuitry. For example, embodiments of a laser source system may comprise circuitry for compensation a nonlinear sweep of wavelength with time from a free-running MEMS oscillator in the data collection process. This can e.g. be done by pre-measuring the wavelength vs. time or by implementing a so-called "k-clock" i.e. by sending the laser output light through a Fabry-Perot cavity or imbalanced interferometer with a small free spectral range to a photodiode and use this signal as trigger for the acquisition, e.g. as described in R. Huber, M. Wojtkowski, K. Taira, J. Fujimoto, and K. Hsu, "Amplified, frequency swept lasers for frequency domain reflectometry and OCT imaging: design and scaling principles," Opt. Express 13, 3513-3528 (2005)

To summarize certain aspects disclosed herein: According to one aspect, disclosed herein are embodiments of a wavelength sweepable laser source, wherein the laser source is a semiconductor laser source adapted for generating laser light at a lasing wavelength, the laser source comprising a substrate, a first reflector, and a second reflector, the first and second reflector together defining an optical cavity, and being arranged to support light oscillation in the optical cavity along an optical path in a direction normal to the substrate, the optical cavity comprising a void in the optical path, the second reflector being resiliently suspended by a suspension in a distance from the first reflector and having a rest position, the second reflector and suspension together defining a microelectromechanical MEMS oscillator, the MEMS oscillator having a resonance frequency and being adapted for oscillating the second reflector on either side of the rest position, the laser source further comprising electrical connections adapted for applying an electric field to the MEMS oscillator.

In some embodiments of the laser source, the second reflector is or comprises a sub-wavelength grating.

In some embodiments of the laser source, the second reflector is or comprises a high index-contrast subwavelength grating HCG.

In some embodiments of the laser source, the second reflector is or comprises a distributed Bragg reflector DBR.

In some embodiments of the laser source, the laser source comprises an anti-reflection coating in the optical path in the cavity. In some embodiments, the anti-reflection coating is fabricated by oxidation of an $Al_xGa_{1-x}As$ layer, where x is larger than 0.7.

In some embodiments of the laser source, the laser source comprises an active region in the optical path of the cavity, the active region comprising at least a first quantum well QW region adapted for having a bandgap corresponding to a first gain wavelength range, the first QW region being located in a first distance from the first reflector. In some embodiments, the active region further comprises a second quantum well QW region adapted for having a bandgap corresponding to a second gain wavelength range, the second QW region being located in a second distance from the first reflector, wherein the second gain wavelength being longer than the first gain wavelength, and the second distance being larger than the first distance. In some embodiments, the laser source supports a first laser mode and a second laser mode, and wherein the first distance is chosen so that an first overlap between the first QW material and the first laser mode is larger than a second overlap between the first QW material and the second laser mode.

In some embodiments of the laser source, the MEMS oscillator has a quality factor Q of about 2 or higher, or about 10 or higher, such as about 80 or higher, and/or wherein the MEMS oscillator has a quality factor of about 300 or lower, or about 200 or lower, such as about 120 or lower.

In some embodiments of the laser source, the MEMS oscillator at least under operation is kept under a medium or low vacuum.

According to another aspect, disclosed herein are embodiments of a swept laser source system, wherein the system comprises:

a laser source according to any of the preceding claims, and a voltage source adapted for applying a modulation voltage to the MEMS oscillator via the electrical connections of the laser source, the voltage source being adapted for modulating the modulation voltage with a modulation frequency, wherein the modulation frequency is substantially equal to or substantially a harmonic of the resonance frequency.

In some embodiments of the laser source system, the modulating voltage is a pulsating direct current DC.

In some embodiments of the laser source system, the modulation voltage is modulated by a waveform that sustains the mechanical oscillation, and wherein waveform is or comprises a pulse train, such as a train of Dirac delta function pulses.

According to yet another aspect, disclosed herein are embodiments of a method of use of a laser source, wherein the laser source comprises a vertical cavity surface emitting laser VCSEL, the VCSEL comprising a first reflector and a microelectromechanical system MEMS second reflector, the second reflector being a part of the VCSEL cavity and being actuatable by an applied voltage to the MEMS, the MEMS having a resonance frequency, the method comprises applying a modulated voltage from a voltage source to the MEMS of the laser source for actuating the position of the second reflector, the voltage having a modulation frequency substantially equal to the resonance frequency or a harmonic thereof.

Embodiments of the various aspects described herein may be used in a number of applications, such as spectroscopy and optical coherence tomography (OCT). In particular, they are attractive in OCT applications as they allow a broad tuning range, single mode operation, and fast sweeping across the tuning bandwidth. Moreover they allow for a compact design.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A wavelength sweepable laser source, wherein the laser source is a semiconductor laser source adapted for generating laser light at a lasing wavelength, the laser source comprising:

a substrate;

a first reflector; and a second reflector, the first and second reflectors together defining an optical cavity, and being arranged to support light oscillation in the optical cavity along an optical path in a direction normal to the substrate, the optical cavity comprising a void in the optical path, the second reflector being resiliently suspended by a suspension at a distance from the first reflector and having a rest position, the second reflector and suspension together defining a microelectromechanical MEMS oscillator, the MEMS oscillator having a resonance frequency and being adapted for oscillating the second reflector on either side of the rest position, the laser source further comprising:

electrical connections and a voltage source connected to the electrical connections adapted for applying an alternating current modulation voltage or a pulsating direct current modulation voltage to the MEMS oscillator so as to sweep the MEMS oscillator both closer to and further away from the first reflector compared to the rest position of the second reflector, wherein the laser source is packaged so as to keep the MEMS oscillator at least under operation under a vacuum having a pressure of 200 Torr or less, and wherein a mechanical quality factor of the packaged MEMS oscillator is at least 10.

2. The wavelength sweepable laser according to claim 1, wherein the second reflector is or comprises a sub-wavelength grating.

3. The wavelength sweepable laser according to claim 1, wherein the second reflector is or comprises a high index-contrast subwavelength grating HCG.

4. The wavelength sweepable laser source according to claim 1, wherein the second reflector is or comprises a distributed Bragg reflector DBR.

5. The wavelength sweepable laser source according to claim 1, wherein the laser source comprises an anti-reflection coating in the optical path in the cavity.

6. The wavelength sweepable laser source according to claim 5, wherein the anti-reflection coating is fabricated by oxidation of an $Al_xGa_{1-x}As$ layer, where x is larger than 0.7.

7. The wavelength sweepable laser source according to claim 1, wherein the laser source comprises an active region in the optical path of the cavity, the active region comprising at least a first quantum well QW region adapted for having a bandgap corresponding to a first gain wavelength range, the first QW region being located in a first distance from the first reflector.

8. The wavelength sweepable laser source according to claim 7, wherein the active region further comprises a second quantum well QW region adapted for having a bandgap corresponding to a second gain wavelength range, the second QW region being located in a second distance from the first reflector, wherein the second gain wavelength being longer than the first gain wavelength, and the second distance being larger than the first distance.

9. The wavelength sweepable laser source according to claim 7, wherein the laser source supports a first laser mode and a second laser mode, and wherein the first distance is chosen so that a first overlap between the first QW region and the first laser mode is larger than a second overlap between the first QW region and the second laser mode.

10. A method of use of a laser source in accordance with claim 1, wherein the laser source comprises a vertical cavity surface emitting laser VCSEL, the VCSEL comprising a first reflector and a microelectromechanical system MEMS second reflector, the second reflector being a part of the VCSEL cavity and being actuatable by an applied voltage to the MEMS, the MEMS having a resonance frequency, the method comprising applying a modulated voltage from a voltage source to the MEMS of the laser source for actuating the position of the second reflector, the voltage having a modulation frequency substantially equal to the resonance frequency or a harmonic thereof.

11. A swept laser source system, wherein the system comprises a laser source and a voltage source, wherein the laser source is a semiconductor laser source adapted for generating laser light at a lasing wavelength, the laser source comprising:
a substrate,
a first reflector, and
a second reflector, the first and second reflectors together defining an optical cavity, and being arranged to support light oscillation in the optical cavity along an optical path in a direction normal to the substrate, the optical cavity comprising a void in the optical path, the second reflector being resiliently suspended by a suspension in a distance from the first reflector and having a rest position, the second reflector and suspension together defining a microelectromechanical MEMS oscillator, the MEMS oscillator having a resonance frequency and being adapted for oscillating the second reflector on either side of the rest position, the laser source further comprising
electrical connections adapted for applying an electric field to the MEMS oscillator;
and wherein the voltage source is adapted for applying a pulsating direct current modulation voltage to the MEMS oscillator via the electrical connections of the laser source, wherein the pulsating direct current voltage has a duty cycle chosen large enough to cause the MEMS oscillator to maintain a mechanical oscillation at an amplitude larger than 50% of the rest gap and small enough to prevent a snap-in of the MEMS oscillator onto the first reflector.

12. The swept laser source system according to claim 11, wherein the voltage source is adapted for modulating the modulation voltage with a modulation frequency matching the resonance frequency.

13. The swept laser source system according to claim 11, wherein the modulation voltage is modulated by a waveform that is or comprises a pulse train.

14. The swept laser source system according to claim 13, wherein the pulse train has a duty cycle of less than 15%.

15. The swept laser source system according to claim 11, comprising a housing; wherein the laser source is disposed within the housing, and wherein the housing is operable to maintain a vacuum within the housing having a pressure of 200 Torr or less.

16. The swept laser source system according to claim 11, wherein the pulsating direct current modulation voltage is configured to impart voltage pulses when the second reflector crosses its rest position and moves towards the first oscillator.

17. A swept laser source system according to claim 11; wherein the voltage source is configured to remove the modulation voltage when the second reflector has a deflection larger than ⅓ of a width of the optical cavity.

18. A method of use of a laser source, wherein the laser source comprises a vertical cavity surface emitting laser VCSEL, the VCSEL comprising a first reflector and a microelectromechanical system MEMS second reflector, the second reflector being a part of the VCSEL cavity and being actuatable by an applied voltage to the MEMS, the MEMS having a resonance frequency, the method comprises applying a modulated pulsating direct current voltage from a voltage source to the MEMS of the laser source for actuating the position of the second reflector, the modulated voltage having a modulation frequency matching the resonance frequency, wherein the pulsating direct current voltage has a duty cycle chosen large enough to cause the MEMS oscillator to maintain a mechanical oscillation at an amplitude larger than 50% of the rest gap and small enough to prevent a snap-in of the MEMS oscillator onto the first reflector.

19. The method according to claim 18, further comprising keeping the MEMS oscillator at least under operation under a medium or low vacuum.

* * * * *